United States Patent
Schmidt

(10) Patent No.: US 6,707,115 B2
(45) Date of Patent: Mar. 16, 2004

(54) TRANSISTOR WITH MINIMAL HOT ELECTRON INJECTION

(75) Inventor: Dominik J. Schmidt, Palo Alto, CA (US)

(73) Assignee: AirIP Corporation, Palo Alto, CA (US)

(*) Notice: Subject to any disclaimer, the term of this patent is extended or adjusted under 35 U.S.C. 154(b) by 0 days.

(21) Appl. No.: 09/836,110

(22) Filed: Apr. 16, 2001

(65) Prior Publication Data

US 2002/0151146 A1 Oct. 17, 2002

(51) Int. Cl.[7] .......................... H01L 29/76; H01L 29/94; H01L 31/062; H01L 31/113; H01L 31/119
(52) U.S. Cl. .................. 257/371; 257/548; 257/549; 257/550; 438/223; 438/224; 438/227; 438/228
(58) Field of Search ................................ 257/371, 548, 257/549, 550; 438/223, 224, 227, 228

(56) References Cited

U.S. PATENT DOCUMENTS

| 4,599,118 A | 7/1986 | Han et al. |
| 4,922,327 A | 5/1990 | Mena et al. |
| 5,191,401 A | 3/1993 | Shirai et al. |
| 5,430,316 A | 7/1995 | Contiero et al. |
| 5,736,766 A | 4/1998 | Efland et al. |
| 5,796,147 A | * 8/1998 | Ono .......................... 257/355 |
| 5,929,496 A | 7/1999 | Gardner et al. |
| 6,172,397 B1 | * 1/2001 | Oonakado et al. .......... 257/321 |
| 2001/0028096 A1 | * 10/2001 | Ohguro et al. .............. 257/501 |

OTHER PUBLICATIONS

Wang, Shyh, Fundamentals of Semiconductor Theory and Device Physics (Prentice Hall) pp. 398–399, 402–403, 492–501 (Month/Year is Unknown).

* cited by examiner

Primary Examiner—David Nelms
Assistant Examiner—Tu-Tu Ho
(74) Attorney, Agent, or Firm—Tran & Associates; B. Tran

(57) ABSTRACT

A device comprising: a layer of gate oxide on a surface of the semiconductor substrate; a gate electrode formed on the surface of the gate oxide, the gate electrode having a drain side; a p-well implanted within a semiconductor substrate under the gate electrode; an n-well implanted in the p-well on the drain side; an n+ source region in the p-well outside of the n-well; an n+ drain region within the substrate inside the n-well; and lightly doped regions extending respectively from the source and drain regions toward the gate electrode.

10 Claims, 2 Drawing Sheets

TRANSISTOR WITH MINIMAL HOT ELECTRON INJECTION

BACKGROUND

The present invention relates to a transistor that is resistant to hot electron injection.

In the quest to add functionality while cutting the price of integrated circuits (ICs), process and device technology have been developed to improve the performance of the ICs. These ICs' fundamental building blocks include transistors. One approach to improve performance involves scaling down the physical dimensions of transistors. Scaling down the physical dimensions increases the number of individual transistors that can be placed onto a single silicon chip or die. More transistors on a single chip lead to increased functionality. Also, since scaled down transistors are close to each other, scaling down the dimensions can result in improved performance, and particularly the speed, of the transistors.

A typical transistor such as a metal-oxide semiconductor field-effect transistor (MOSFET) uses a gate to control an underlying surface channel joining a source and a drain. The channel, source and drain are located in a semiconductor substrate, with the source and drain being doped oppositely to the substrate. The gate is separated from the semiconductor substrate by an insulating layer such as a gate oxide. The operation of the transistor involves applying an input voltage to the gate to set up a transverse electric field in the channel in order to modulate the longitudinal conductance of the channel.

One method to increase the speed of a transistor is to reduce the length of the conduction channel underneath the gate and gate oxide regions. For example, MOSFET devices have been scaled to the point where the channel length from source to drain falls below 0.18 micron (deep submicron). As the channel shrinks, the maximum electric field (E-field) in the channel region increases, thereby resulting in higher substrate current and short/long term hot electron reliability problems. Electrons traveling through the channel become more energized by the E-field and have a greater tendency to cross into the gate region and become trapped. The short channel lengths involved in such scaled down transistors have involved limitations from the electrical characteristics present in such scaled down devices. The limitations on such short channel device have included limited drain voltage, threshold voltage ($V_T$) falloff, and impact ionization in the drain pinchoff region. The drain voltage is limited by punch-through, snap back and gate field enhanced P-N junction avalanche breakdown. The threshold voltage falloff is caused by the drain field induced barrier lowering and the drain and poor control over source junction doping profile and substrate doping concentration. As transistor dimensions are reduced and the supply voltage remains constant, the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Thus, the impact ionization in the drain pinchoff region leads to hot-electron injection into the gate oxide as well as hot-electron injection into the substrate. Trapped charge in the gate insulator due to injected hot carriers accumulates over time and can lead to a permanent change in the threshold voltage of the device. Thus, a point exists where heightened speed and reduced dimensions leads to transistor breakdown.

Also, the hot electrons can travel long distances in the semiconductor substrate, eventually reaching areas with low noise circuitry where they can substantially increase the noise floor. Such low noise circuits include, among others, CMOS imagers, high resolution analog to digital converters and digital to analog converters, and radio frequency low noise amplifiers. These problems are particularly acute in mixed mode circuits with a combination of digital and analog circuitry.

Various methods have been employed to partially overcome these problems and maximize performance and reliability. One common method involves adding a first lightly doped region between the drain and channel regions and a second lightly doped region between the source and channel regions. After patterning the polysilicon gate, a low dosage phosphorous implant and a high temperature drive is used to create N− regions adjacent to the gate. After formation of the insulating sidewall spacer structures, a high dosage arsenic implant and drive can be used to create N+ source and drain regions which supersede most of the lightly doped N− regions. What remains are lightly doped regions separating the source and drain from the channel. This structure has come to be known as a lightly doped drain (LDD) structure.

The use of LDD structures to relax the E-field is well known, as discussed in U.S. Pat. No. 6,159,813. However, as the devices get smaller, and FET channels become shorter than 0.4 microns, limitations on fabrication precision result in structures that are far from ideal. Due to its high diffusivity, the phosphorous in the N− regions further diffuses into the channel during the high heat drive processes required to create the N+ source and drain regions. An alternative to the phosphorous LDD (phos-LDD) approach is to use arsenic to create the LDD structures. The fabrication processes required to create an arsenic LDD (As-LDD) proceed similarly to the phosphorous LDD processes. The LDD structure can be created by first implanting a low dosage, self-aligned arsenic implant prior to sidewall spacer formation. This implant is then diffused into the substrate through a heating drive process, resulting in the lightly doped N− regions. Arsenic's low diffusivity can cause the LDD regions to have an abrupt end below the edges of the gate region. This abruptness creates an E-field that is still unsuitable in sub half-micron devices due to the resulting hot electron reliability problem. Another method to reduce the E-field involves burying the drain/channel and source/channel junctions. The transistor includes N+ source and drain regions each having a projection that exists a distance below the channel/gate dielectric material layer. This moves the highest concentration of hot-electrons deeper into the channel area and away from the gate dielectric region. Buried structures incorporating LDD regions and graded combination structures have also been created, but at the expense of device speed. Although these structures reduce the hot electron problem, they can be costly to fabricate. Finally, most of the methods used to prevent hot electron effects also increase the series resistance of the transistor, since they introduce a high resistance, lowly doped region between the drain and source electrodes and the gate channel. This region limits the voltage reaching the channel through voltage (I*R) drops.

SUMMARY

In one aspect, a device includes a layer of gate oxide on a surface of the semiconductor substrate; a gate electrode formed on the surface of the gate oxide, the gate electrode having a drain side; a p-well implanted within a semiconductor substrate under the gate electrode; an n-well implanted in the p-well on the drain side; an n+ source region in the p-well outside of the n-well; an n+ drain region within the substrate inside the n-well; and lightly doped regions extending respectively from the source and drain regions toward the gate electrode.

Implementations of the device may include one or more of the following. The n-well extends slightly under the gate electrode. The p-well is deeper than the n-well. A second device can be fabricated adjacent the first device with a second gate electrode formed on the surface of the gate oxide; a second n-well implanted within a semiconductor substrate under the second gate electrode; a p+ source region in the second n-well; and a p+ drain region within the substrate inside the second n-well. The second n-well is adjacent the p-well. The first and second n-wells are formed at the same time. The device can be used in digital circuits that operate next to sensitive analog circuits such as CMOS imaging elements, precision analog-digital converters, or radio frequency circuits.

In another aspect, a method for manufacturing a metal oxide semiconductor transistor device includes implanting a p-well in a substrate; implanting an n-well in the p-well; growing a gate oxide above the p-well; forming a polysilicon layer on the gate oxide; implanting a p+ region in the substrate; and implanting an n+ region in the substrate.

Implementations of the above aspect may include one or more of the following. The method includes forming lightly doped regions extending respectively from the source and drain regions toward the gate electrode. The method also includes forming an isolation layer between the substrate and the gate oxide. The method includes patterning the polysilicon layer. The method also includes patterning the p+ region and the n+ region. The method forms robust devices that can used in digital circuitry adjacent analog circuitry. The analog circuit can be imaging elements, analog to digital converters or a radio frequency circuits, among others.

Advantages of the device can include one or more of the following. The invention provides a process for creating reliable and inexpensive MOSFETs. The MOSFETs can be used in mixed-mode integrated circuits (ICs) that include both digital and analog circuits on a single chip. The device reduces the magnitude of electric field seen along the channel near the drain of an MOS device, especially in digital transistors which switch at high frequency. The device also avoids the hot electron injection problem without creating sharp curvatures on the junction and without an additional long drive-in time that can cause undesired thermal effects in the other parts of the device. The resultant low junction curvature increases the breakdown voltage, making it possible to operate the transistor at higher biases without catastrophic failure. The inventive process also forms source/drain regions having low series resistance and a large junction radius, and which does not require additional masking or heating steps.

BRIEF DESCRIPTION OF THE DRAWINGS

The following detailed description of the embodiments can best be understood when read in conjunction with the following drawings, in which.

DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
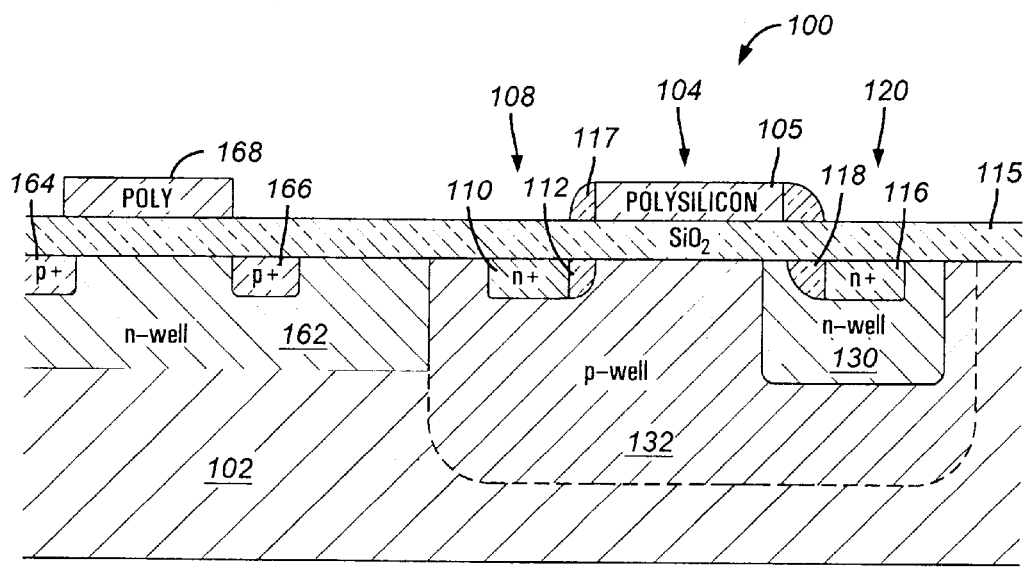
FIG. 1 illustrates an exemplary completed MOSFET structure.

FIG. 1 illustrates one FET of a large scale integrated circuit fabricated in accordance with the process of the present invention, the FET device being generally identified by the reference numeral 100. The substrate region 102 of the device is a silicon material lightly doped with a p-type material, such as boron, and designated as a p-substrate. A gate 104 is separated from the silicon substrate 102 by a layer of silicon dioxide 115. A channel region above the p-substrate region 102 and below the gate 104 is slightly more heavily doped p-type material than substrate 102 and is designated as a p-well 132. A source 108 and drain 120 are formed by heavily doping a region of the p-well 132 on opposite sides of the gate 104 with an n-type material and designated as a n+ regions 110 and 116. Lightly doped drain (LDD) structures 112 and 118, created by implanting shallow n−, forming oxide spacers 117 adjacent to the polysilicon layer 105, and implanting the n+. The n+ region 116 and its LDD structure 118 are placed in an n-well 130. The n-well 130 in turn is positioned in a p-well 132. The n+ region 110 and its LDD 112 are also positioned in the p-well 132. This device is known as an NMOS device and it is this device that suffers from hot electron injection.

The p-well 132 is adjacent to an n-well 162, which contains two p+ regions 164 and 166. A polysilicon layer 168 is deposited above the silicon dioxide layer 115 to form a gate. The layer of polysilicon material is next implanted with phosphorous, an N-type material. The layer of polysilicon material implanted with phosphorous is then oxidized with a layer of silicon dioxide. This device is commonly known as a PMOS device, and it typically does not suffer from hot electron problems.

Figure 2:
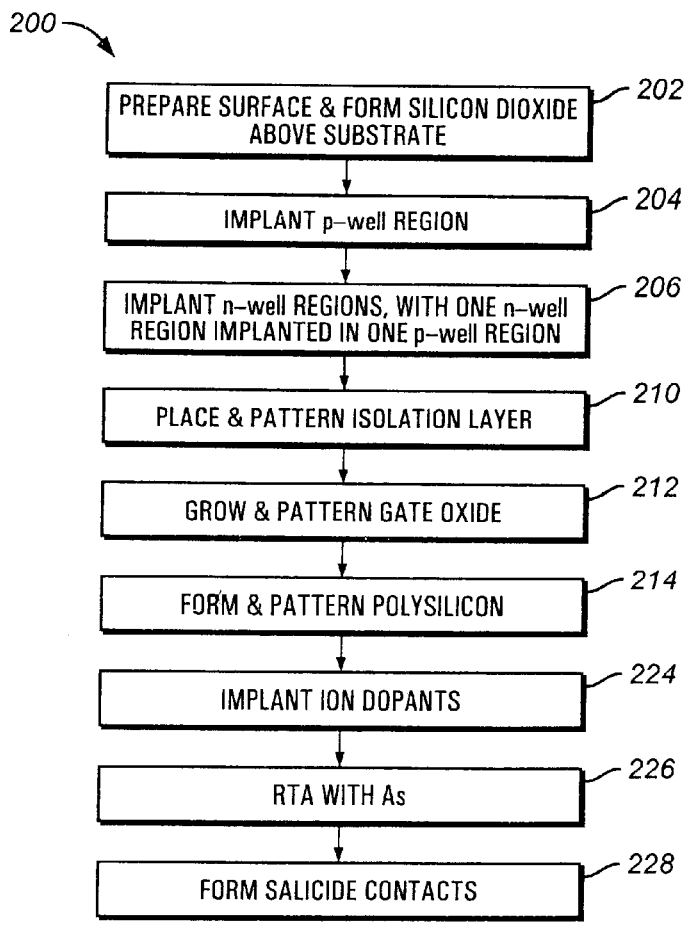
FIG. 2 shows an exemplary process for making an MOSFET with a highly scalable conduction channel length.

FIG. 2 shows an exemplary method 200 for fabricating the FET of FIG. 1. First, the silicon surface is prepared and the layer of silicon dioxide 115, approximately 80 angstroms thick, is grown atop the substrate 102 (step 202). Next, p-well regions are implanted (step 204). Next, n-well regions are implanted in the surface (step 206). In particular, the p-well regions are deeper than the n-well regions and one n-well region is implanted within one of the p-well regions.

An isolation layer is placed and patterned (step 210). A gate oxide is grown and patterned (step 212). The gate oxide layer 115 can be formed through any suitable process, such as by chemical vapor deposition (CVD). In an alternative embodiment, the gate oxide is thermally grown on the substrate 102. Next, the polysilicon layer 115 is formed and patterned (step 214). The layer of undoped polysilicon is deposited on the top surface of gate oxide 104 and can be deposited by any suitable method, such as by CVD. The upper surface of the structure can be planarized through chemical mechanical polishing (CMP). The patterning process involves photoresist is deposited as a continuous layer on polysilicon and selectively irradiated using a photolithographic system, such as a step and repeat optical projection system, in which I-line ultraviolet light from a mercury-vapor lamp is projected through a first reticle and a focusing lens to obtain an image pattern. Thereafter, the photoresist is developed and the irradiated portions of the photoresist are removed to provide openings in photoresist. The openings expose portions of polysilicon layer to an etch, thereby defining a gate region. An anisotropic etch is applied that removes the exposed portions of polysilicon 105. Various etchants can be used to anisotropically etch or to selectively remove the polysilicon and oxide layers. After the etching step or steps, the gate region 104 remains. The gate region 104 includes: the polysilicon layer 105 on top of the gate oxide 115 on top of the substrate 102. The photoresist is stripped, using conventional photoresist stripping techniques.

The source region 108 and a drain region 120 are provided by implanting ion dopants into the top of the substrate 102 (step 224). The ion implantation uses conventional ion implanting techniques. In one embodiment, the source and drain LDD regions 112 and 118 respectively, include the phosphorous-doped silicon material. The gate 104 behaves as an implant mask and provides for self-aligned source and drain LDD regions, 112 and 118 respectively. The p+ region is also placed using conventional process.

Next, a high temperature rapid thermal anneal (RTA) is conducted in the presence of Arsenic (As) gas (step 226). This process cures out the crystal damage induced by the previous ion implant process. Additionally, the annealing step is performed in the presence of As gas. The presence of the As gas causes an additional doping implantation into the substrate 102. An oxide layer is subsequently deposited and etched anisotropically, resulting in spacers 117 next to the poly gate 105. The n+ source/drain regions 110 and 116, are formed in the pwell 132, next to the spacers 117, in the region where the gate oxide 115 has been etched back. These highly doped regions form electrical connections to the drain/source electrodes, 108 and 120 respectively.

Next, salicide contacts are formed on the gate 104, source 108, drain 120 and lightly doped regions 112 and 118 (step 228). Additionally contact formation, not included here, is achieved using conventional techniques. These further processing steps are not repeated herein. Likewise, the principal processing steps disclosed herein may be combined with other steps apparent to those skilled in the art.

The application of the extra nwell region around the drain of the NMOS transistor reduces hot electron effects by reducing the electric field in the pinchoff region. The electric field is proportional to the voltage drop across the pinch-off region divided by the length of the pinch-off region. The nwell region extends laterally with a smooth decrease in doping, so that part of the drain voltage is dropped across the nwell region. Also, the pinchoff region is extended somewhat because the channel is counterdoped, resulting in lower doping in the pinchoff area, which in turn increases the pinchoff length. The field is therefore significantly reduced, and since the hot electron current depends exponentially on the field, there is a very large corresponding decrease in this current.

Figure 3:
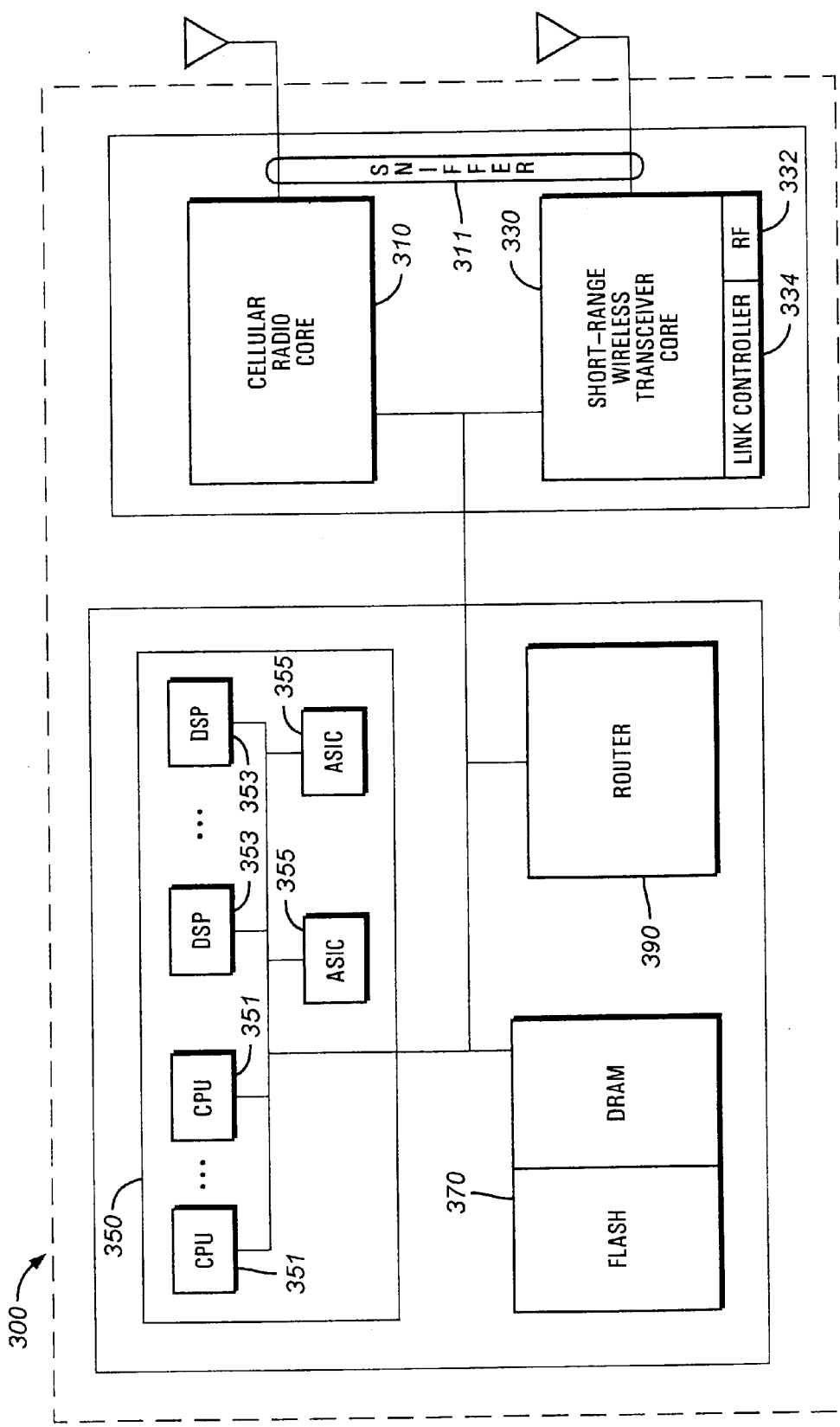
FIG. 3 is a block diagram of a portable appliance using the transistor of FIG. 1.

Thus the invention provides a method and structure for a transistor whose gate is protected from "hot electron injection." Advantageously, the transistor is well-suited for use in a device such as a mixed signal integrated circuit chip, as well as an electronic system including a processor/memory and analog components such as A/D and D/A converters, imagers and RF circuits. The electronic system may also be a portable appliance as shown in FIG. 3. The information handling system 200 deploys transistor devices formed as discussed above. The device has a fast and reliable channel having a long life.

FIG. 3 shows a block diagram of a multi-mode wireless communicator device 300 fabricated on a single silicon integrated chip. In one implementation, the device 300 is an integrated CMOS device with an A/D converter, radio frequency (RF) circuits, including a cellular radio core 310, a short-range wireless transceiver core 330, and an RF sniffer 311, along side digital circuits, including a reconfigurable processor core 350, a high-density memory array core 370, and a router 390. The high-density memory array core 370 can include various memory technologies such as flash memory and static random access memory (SRAM), among others, on different portions of the memory array core. Through the router 390, the multi-mode wireless communicator device 300 can detect and communicate with any wireless system it encounters at a given frequency. The router 390 performs the switch in real time through an engine that keeps track of the addresses of where the packets are going. The router 390 can send packets in parallel through two or more separate pathways.

The reconfigurable processor core 350 controls the cellular radio core 310 and the short-range wireless transceiver core 330 to provide a seamless dual-mode network integrated circuit that operates with a plurality of distinct and unrelated communications standards and protocols such as Global System for Mobile Communications (GSM), General Packet Radio Service (GPRS), Enhance Data Rates for GSM Evolution (Edge) and Bluetooth™. The cell phone core 310 provides wide area network (WAN) access, while the short-range wireless transceiver core 330 supports local area network (LAN) access. The reconfigurable processor core 350 has embedded read-only-memory (ROM) containing software such as IEEE802.11, GSM, GPRS, Edge, and/or Bluetooth™ protocol software, among others.

In one embodiment, the cellular radio core 310 includes a transmitter/receiver section that is connected to an off-chip antenna (not shown). The transmitter/receiver section is a direct conversion radio that includes an I/Q demodulator, transmit/receive oscillator/clock generator, multi-band power amplifier (PA) and PA control circuit, and voltage-controlled oscillators and synthesizers. In another embodiment of transmitter/receiver section 312, intermediate frequency (IF) stages are used. In this embodiment, during cellular reception, the transmitter/receiver section converts received signals into a first intermediate frequency (IF) by mixing the received signals with a synthesized local oscillator frequency and then translates the first IF signal to a second IF signal. The second IF signal is hard-limited and processed to extract an RSSI signal proportional to the logarithm of the amplitude of the second IF signal. The hard-limited IF signal is processed to extract numerical values related to the instantaneous signal phase, which are then combined with the RSSI signal.

For voice reception, the combined signals are processed by the processor core 350 to form PCM voice samples that are subsequently converted into an analog signal and provided to an external speaker or earphone. For data reception, the processor simply transfers the data over an input/output (I/O) port. During voice transmission, an off-chip microphone captures analog voice signals, digitizes the signal, and provides the digitized signal to the processor core 350. The processor core 350 codes the signal and reduces the bit-rate for transmission. The processor core 350 converts the reduced bit-rate signals to modulated signals, for example. During data transmission, the data is modulated and the modulated signals are then fed to the cellular telephone transmitter of the transmitter/receiver section.

Turning now to the short-range wireless transceiver core 330, the short-range wireless transceiver core 330 contains a radio frequency (RF) modem core 332 that communicates with a link controller core 334. The processor core 350 controls the link controller core 334. In one embodiment, the RF modem core 332 has a direct-conversion radio architecture with integrated VCO and frequency synthesizer. The RF-unit 332 includes an RF receiver connected to an analog-digital converter (ADC), which in turn is connected to a modem 316 performing digital modulation, channel filtering, AFC, symbol timing recovery, and bit slicing operations. For transmission, the modem is connected to a digital to analog converter (DAC) that in turn drives an RF transmitter.

According to one implementation, when the short-range wireless core 330 in the idle mode detects that the short-range network using Bluetooth™ signals, for example, have dropped in strength, the device 300 activates the cellular radio core 310 to establish a cellular link, using information from the latest periodic ping. If a cellular connection is established and Bluetooth™ signals are weak, the device 300 sends a deregistration message to the Bluetooth™ system and/or a registration message to the cellular system. Upon registration from the cellular system, the short-range transceiver core 330 is turned off or put into a deep sleep mode and the cellular radio core 310 and relevant parts of the synthesizer are powered up to listen to the cellular channel.

The router 390 can send packets in parallel through the separate pathways of cellular or Bluetooth™. For example, if a Bluetooth™ connection is established, the router 390 knows which address it is looking at and will be able to immediately route packets using another connection standard. In doing this operation, the router 390 pings its environment to decide on optimal transmission medium. If the signal reception is poor for both pathways, the router 390 can send some packets in parallel through both the primary and secondary communication channel (cellular and/or Bluetooth™) to make sure some of the packets arrive at their destinations. However, if the signal strength is adequate, the router 390 prefers the Bluetooth™ mode to minimize the number of subscribers using the capacity-limited and more expensive cellular system at any give time. Only a small percentage of the device 300, those that are temporarily outside the Bluetooth coverage, represents a potential load on the capacity of the cellular system, so that the number of mobile users can be many times greater than the capacity of the cellular system alone could support. All the above implementations have circuits combining low noise devices with high-speed, high-noise digital transistors on the same silicon substrate. By using the present invention on the digital transistors closest to the low-noise sections, the impact of the generated noise can be greatly reduced.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A device comprising:
    a layer of gate oxide on a surface of the semiconductor substrate;
    a gate electrode formed on the surface of the gate oxide, the gate electrode having a drain side;
    a p-well implanted within a semiconductor substrate under the gate electrode;
    an n-well implanted in the p-well on the drain side;
    an n+ source region in the p-well outside of the n-well; and
    an n+ drain region within the substrate inside the n-well.

2. The device of claim 1, wherein the n-well extends slightly under the gate electrode.

3. The device of claim 1, further comprising digital circuitry positioned adjacent the device.

4. The device of claim 1, wherein the p-well is deeper than the n-well.

5. The device of claim 1, further comprising a second device, comprising:
    a second gate electrode formed on the surface of the gate oxide;
    a second n-well implanted within a semiconductor substrate under the second gate electrode;
    a p+ source region in the second n-well; and
    a p+ drain region within the substrate inside the second n-well.

6. The device of claim 5, wherein the second n-well is adjacent the p-well.

7. The device of claim 1, wherein the first and second n-wells are formed at the same time.

8. The device of claim 1, wherein the device is used in a digital circuit adjacent to a CMOS imaging element.

9. The device of claim 1, wherein the device is used in a digital circuit adjacent to a data converter.

10. The device of claim 1, wherein the device is used in a digital circuit adjacent to a radio frequency circuit.

* * * * *